(12) United States Patent
Kawashima

(10) Patent No.: US 6,991,896 B2
(45) Date of Patent: Jan. 31, 2006

(54) EXPOSURE METHOD

(75) Inventor: Miyoko Kawashima, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 368 days.

(21) Appl. No.: 10/456,387

(22) Filed: Jun. 5, 2003

(65) Prior Publication Data

US 2003/0226980 A1    Dec. 11, 2003

(30) Foreign Application Priority Data

Jun. 5, 2002   (JP) ............................. 2002-164978

(51) Int. Cl.
*G03C 5/00*   (2006.01)

(52) U.S. Cl. ..................... 430/394; 430/5; 250/492.22; 355/67

(58) Field of Classification Search ..................... None
See application file for complete search history.

(56) References Cited

U.S. PATENT DOCUMENTS

| | | | |
|---|---|---|---|
| 6,150,059 A | 11/2000 | Tanabe et al. | 430/5 |
| 2002/0045134 A1 | 4/2002 | Inoue et al. | 430/311 |
| 2002/0177048 A1 * | 11/2002 | Saitoh et al. | 430/5 |
| 2003/0198872 A1 * | 10/2003 | Yamazoe et al. | 430/5 |

FOREIGN PATENT DOCUMENTS

| | | |
|---|---|---|
| JP | 3119217 | 10/2000 |
| JP | 2002/122976 | 4/2002 |
| WO | 02/088843 A2 | 11/2002 |

* cited by examiner

*Primary Examiner*—John A. McPherson
*Assistant Examiner*—Daborah Chacko-Davis
(74) *Attorney, Agent, or Firm*—Morgan & Finnegan, LLP

(57) ABSTRACT

An exposure method includes the steps of providing a mask that arranges a contact-hole pattern and a pattern smaller than the contact-hole pattern, and illuminating the mask using plural kinds of light so as to resolve the contact-hole pattern and restrain the smaller pattern from resolving on an object to be exposed via a projection optical system, wherein the following conditions are met $A=-1.7k_1+C1$, $1.2 \leq C1 \leq 1.3$, $0.5 \leq B \leq 0.55$ and $B \leq A-0.1$, $0.80 \leq \sigma \leq 0.9$ and $\sigma \geq A+0.1$, $k_1=(L/\lambda)NA$, where $k_1$ is resolving power, L is a hole diameter of the contact-hole pattern, $\lambda$ is a wavelength for exposure, NA is a numerical aperture of the projection optical system, $\sigma$ is a ratio of a numerical aperture of an illumination optical system to the numerical aperture of the projection optical system, A and B are distances from two orthogonal axes to a boarder of a light-shielding part in an effective light source for illumination of plural kinds of light, the light-shielding part being symmetrical with respect to the two orthogonal axes.

5 Claims, 13 Drawing Sheets

INFLUENCE OF PATTERN BIAS ON CD DEVIATION    120nm HOLE

120nm CD DEVIATION

| | | | | |
|---|---|---|---|---|
| 114 | | | | |
| 108 | | | 8.3 | 10.6 |
| 102 | | 9.1 | 10.9 | 12.4 |
| 96 | 9.9 | 11.8 | 13.4 | 14.8 |
| 90 | 12.8 | 14.5 | 15.9 | 17.2 |
| dummy/pattern | 120 | 126 | 132 | 138 |

FIG. 7

INRLUENCE OF PATTERN BIAS ON MEF DEVIATION    120nm HOLE

120nm MEF DEVIATION

| | | | | |
|---|---|---|---|---|
| 114 | | | | |
| 108 | | | 3.01 | 2.8 |
| 102 | | 3.04 | 2.8 | 2.61 |
| 96 | 3.08 | 2.8 | 2.59 | 2.43 |
| 90 | 2.81 | 2.57 | 2.39 | 2.26 |
| dummy/pattern | 120 | 126 | 132 | 138 |

FIG. 8

INFLUENCE OF PATTERN BIAS ON DOF     120nm HOLE

120nm DOF

| | 120 | 126 | 132 | 138 |
|---|---|---|---|---|
| 114 | | | | |
| 108 | | | 0.283 | 0.271 |
| 102 | | 0.28 | 0.269 | 0.26 |
| 96 | 0.278 | 0.2666 | 0.258 | 0.251 |
| 90 | 0.264 | 0.256 | 0.249 | 0.244 |
| dummy/pattern | 120 | 126 | 132 | 138 |

120nm CONTACT HOLE     MEF PITCH DEPENDENCY

RELATIONSHIP AMONG MEF
AND EFFECTIVE LIGHT-SOURCE PARAMETER σ

RELATIONSHIP AMONG DOF
AND EFFECTIVE LIGHT-SOURCE PARAMETER σ

EXPOSURE METHOD

This application claims the right of priority under 35 U.S.C. §119 based on Japanese Patent Application No. 2002-164978, filed on Jun. 5, 2002, which is hereby incorporated by reference herein in its entirety as if fully set forth herein.

BACKGROUND OF THE INVENTION

The present invention relates generally to a mask pattern and a method for setting an optimal illumination condition to the mask pattern, and more particularly to a mask pattern and a method for setting an illumination condition suitable of a method of exposing a mask that arranges a desired pattern and an auxiliary or dummy pattern (these terms are used interchangeably in this application) smaller than the desired pattern, by illuminating the mask (reticle) using plural kinds of light so as to resolve the desired pattern and restrain the auxiliary pattern from resolving on an object to be exposed via a projection optical system.

The projection exposure apparatus is used in manufacturing devices, such as ICs, LSIs and liquid crystal panels, using the photolithography. For improved resolution, the projection exposure apparatus has generally shortened its exposure wavelength and enlarged a numerical aperture ("NA") in the projection optical system.

In general, the resolving power improves with a shortened wavelength of exposure light and increased NA, while the projection exposure apparatus, from its nature, resolves some patterns relatively easily but cannot resolve other patterns easily. In general, it may be said that a line pattern more easily resolves than a contact-hole pattern, and thus a width in the contact-hole pattern is larger than that of the line pattern in a semiconductor chip. It is therefore an issue in fine processing in the photolithography to make a fine contact-hole pattern. More specifically, exposure cannot easily obtain the resolving power, depth of focus ("DOF"), and exposure dose tolerance for contact holes. In addition, the contact holes have a much larger mask error enhancement factor ("MEF") that is a degree to emphasize a mask error, than the line pattern, which hinders fine processing.

Accordingly, Japanese Patent No. 3,119,217 (corresponding to U.S. Pat. No. 6,150,059) as one solution for this problem discloses a method to improve resolving power and DOF to some extent by forming, among openings, auxiliary openings so dimensioned that they are not resolved by exposure. Japanese Laid-Open Patent Application No. 2002-122976 (corresponding to U.S. Patent Application Publication No. 2002-045136) provides more concrete embodiments to this method.

These methods are effective to resolve contact holes of about 200 nm as in their embodiments but insufficient to resolve currently demanded 120 nm contact holes. More specifically, when the resolving power to 200-nm holes is converted into resolving power $k_1$ for exposure using a general exposure apparatus at the time of filing of these applications which uses, for example, a KrF laser light source and NA=0.6 to 0.5, $k_1$ becomes between 0.48 and 0.40. This conversion is performed with $k_1$=(hole diameter of a desired contact hole)/($\lambda$/NA) as a variation of Rayleigh's equation: (hole diameter of a desired contact hole) =$k_1$($\lambda$/NA). This converted $k_1$ value corresponds to the resolving power of 163 to 136 nm for exposure using a currently available general exposure apparatus which uses, for example, a KrF laser light source and NA=0.73. It is therefore understood that the methods disclosed in these applications may resolve holes with a size of 163 to 136 nm, but cannot resolve holes with a size of 120 nm or smaller. Incidentally, 163 nm and 136 nm may be obtained as follows: (hole diameter of a desired contact hole)=$k_1$($\lambda$/NA) =0.48×248/0.73=163 (nm) for $k_1$=0.48, while (hole diameter of a desired contact hole)=$k_1$($\lambda$/NA)=0.40×248/0.73=136 (nm) for $k_1$=0.40.

BRIEF SUMMARY OF THE INVENTION

Accordingly, it is an exemplified object of the present invention to provide an exposure method for resolving fine contact holes of 120 nm or smaller with resolving power $k_1$=0.35 under practical DOF, using a current typical exposure apparatus that uses a KrF laser light source with an approximately wavelength of 248 nm and NA=0.73.

Japanese Patent Application No. 2002-123268 (corresponding to U.S. patent application Ser. No. 10/132,001, filed on Apr. 24, 2002) proposes, for the resolving power $k_1$=0.35 or smaller, an exposure method for exposing a mask that arranges a contact-hole pattern and a pattern smaller than the contact-hole pattern, by illuminating the mask using plural kinds of light so as to resolve the contact-hole pattern and restrain the smaller pattern from resolving on an object to be exposed via a projection optical system. It is a more specific object of the present invention to obtain larger process tolerance including DOF and exposure dose or establish a stable process less influenced by the mask errors and exposure conditions, such as a change of exposure dose and a defocus error.

An exposure method of one aspect of the present invention includes the steps of providing a mask that arranges a contact-hole pattern and a pattern smaller than the contact-hole pattern, and illuminating the mask using plural kinds of light so as to resolve the contact-hole pattern and restrain the smaller pattern from resolving on an object to be exposed via a projection optical system, wherein $A=-1.7k_1+C1$, $1.2 \leq C1 \leq 1.3$, $0.5 \leq B \leq 0.55$ and $B \leq A-0.1$, $0.80 \leq \sigma \leq 0.9$ and $\sigma \geq A+0.1$, $k_1=(L/\lambda)NA$, where $k_1$ is resolving power, L is a hole diameter of the contact-hole pattern, $\lambda$ is a wavelength for exposure, NA is a numerical aperture of the projection optical system, $\sigma$ is a ratio of a numerical aperture of an illumination optical system to the numerical aperture of the projection optical system, A and B are distances from two orthogonal axes to a boarder of a light-shielding part in an effective light source for illumination of plural kinds of light, the light-shielding part being symmetrical with respect to the two orthogonal axes.

Conditions $A=-1.7k_1+1.25$, $k_1 \leq 0.4$, $B=0.55$, $\sigma=0.85$ may be met irrespective of the hole diameter.

An exposure method of the present invention includes the steps of providing a mask that arranges a contact-hole pattern and a pattern smaller than the contact-hole pattern, and illuminating the mask using plural kinds of light so as to resolve the contact-hole pattern and restrain the smaller pattern from resolving on an object to be exposed via a projection optical system, wherein $A=1/(4k_1)-C2/(4k_1)^2$, $0.07 \leq C2 \leq 0.20$, $0.5 \leq B \leq 0.55$ and $B \leq A-0.1$, $0.80 \leq \sigma \leq 0.9$ and $\sigma \geq A+0.1$, $k_1=(L/\lambda)NA$, where $k_1$ is resolving power, L is a hole diameter of the contact-hole pattern, $\lambda$ is a wavelength for exposure, NA is a numerical aperture of the projection optical system, $\sigma$ is a ratio of a numerical aperture of an illumination optical system to the numerical aperture of the projection optical system, A and B are distances from two orthogonal axes to a boarder of a light-shielding part in an effective light source for illumination of plural kinds of light, the light-shielding part being symmetrical with respect to the two orthogonal axes.

The effective light source has a shape shown in FIG. 1 or 4.

An exposure method of still another aspect of the present invention includes the step of providing a mask that arranges a contact-hole pattern and a pattern smaller than the contact-hole pattern, and the step of illuminating the mask using plural kinds of light so as to resolve the contact-hole pattern and restrain the smaller pattern from resolving on an object to be exposed via a projection optical system, wherein $0.7 \leq d/t \leq 0.80$ is met where d is a size of an opening in the smaller pattern, and t is a size of an opening in the contact-hole pattern.

An exposure method of another aspect of the present invention include the step of providing a mask that arranges a contact-hole pattern and a pattern smaller than the contact-hole pattern, and the step of illuminating the mask using plural kinds of light so as to resolve the contact-hole pattern and restrain the smaller pattern from resolving on an object to be exposed via a projection optical system, wherein $0.75 \leq d/t \leq 0.90$ is met where d is a size of an opening in the smaller pattern, and t is a size of an opening in the contact-hole pattern.

A condition $0.85L \leq t \leq 1.15L$ may be met where L is a hole diameter of the contact-hole pattern.

A device fabricating method of still another aspect of the present invention includes the step of exposing an object using the above exposure method, and performing a predetermined process for the exposed object. Claims for a device fabricating method that performs operations similar to that of the above exposure apparatus cover devices as intermediate and final products. Such devices include semiconductor chips like an LSI and VLSI, CCDs, LCDs, magnetic sensors, thin film magnetic heads, and the like.

Other objects and further features of the present invention will become readily apparent from the following description of the preferred embodiments with reference to accompanying drawings.

BRIEF DESCRIPTION OF THE DRAWINGS

FIG. 7 is a table showing a relationship between pattern bias and critical dimension error deviation.

FIG. 8 is a table showing a relationship between pattern bias and mask enhancement factor.

DETAILED DESCRIPTION OF THE PREFERRED EMBODIMENTS

It is an exemplary object to optimize parameters for an exposure method for exposing with a mask that arranges a contact-hole pattern and a pattern smaller than the contact-hole pattern, by illuminating the mask using plural kinds of light so as to resolve the contact-hole pattern and restrain the smaller pattern from resolving on an object to be exposed via a projection optical system. The parameters include a size or hole diameter L of the contact-hole pattern to be finally formed on an image plane, a size "t" of each hole in the mask pattern to be resolved, a size "d" of a dummy or auxiliary opening not to be resolved, a parameter a in an effective light source shown in FIG. 1, which will be described later, i.e., a ratio of a NA of an illumination optical system to the NA of the projection optical system, and sizes A and B of central light-shielding part.

Figure 2:
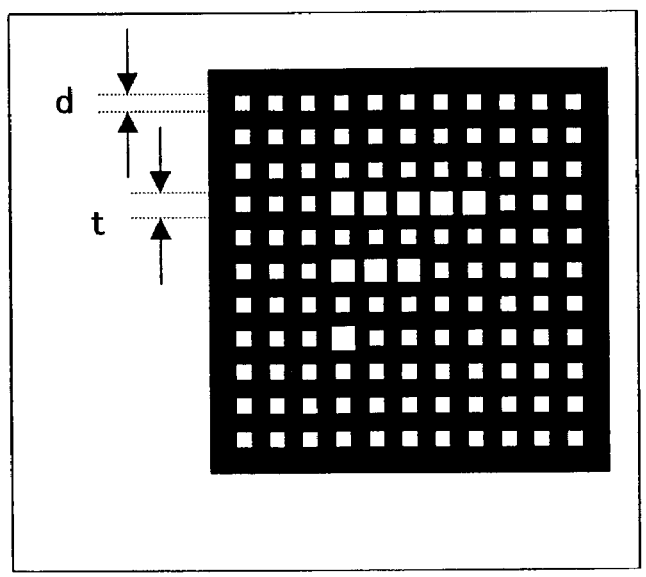
FIG. 2 is a schematic plane view of a mask pattern used for the inventive exposure method.
Figure 3:
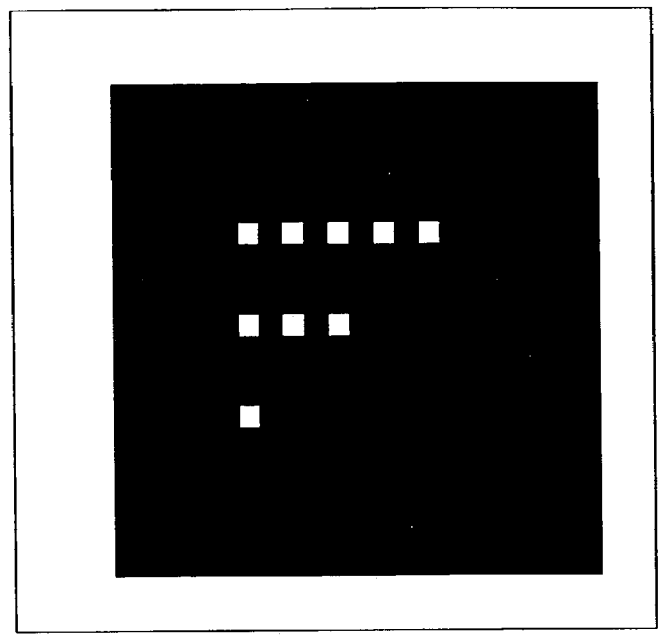
FIG. 3 is a desired image pattern when the mask pattern shown in FIG. 2 images.

FIG. 3 shows an exemplary desired pattern to be resolved. A size of the opening is 120 nm or smaller. The mask pattern size has four or five times as large as the desired size according to the magnification of the exposure apparatus, but this embodiment converts the size into that on the image plane or without taking the magnification into consideration. A binary mask has a mask pattern and light-shielding part around the mask pattern, as shown in FIG. 2. While the following description uses the binary mask as an exemplary mask, the mask may use an attenuated phase shift mask that allows light-shielding part to slightly transmit the light and shifts its light phase by 180 degrees from that of opening part. The mask pattern includes a desired pattern shown in FIG. 3 and unresolved auxiliary openings around the desired pattern. The auxiliary openings are positioned determined such that the desired pattern and auxiliary openings form periodicity. Although the desired pattern and auxiliary opening are illustrated as square shapes in the drawing, they are not limited to a square shape and may use a octagon that has been formed by chamfering corners of the square, a circle, and any other shape.

As shown in FIG. 2, an opening size of the pattern is set to "t" for a contact-hole size to be resolved, and "d" for an auxiliary opening not to be resolved. The resolving power $k_1$ in this case may be standardized using an exposure wavelength λ to expose the wafer and an NA of the projection optical system expressed as a modification of Rayleigh's equation as follows:

Resolving Power $k_1 = (L/λ)NA$ where L is a size or hole diameter of the contact-hole pattern to be finally obtained.

Figure 1:
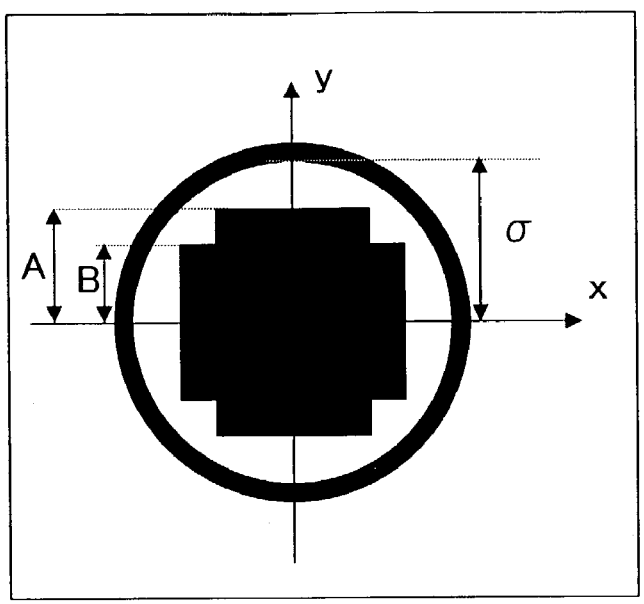
FIG. 1 is a schematic plane view of an effective light source shape used for an exposure method according to the present invention.
Figure 4:
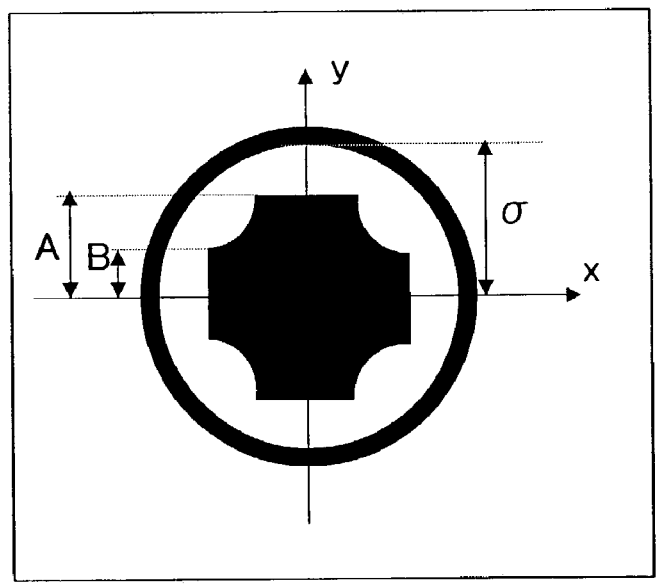
FIG. 4 is a schematic plane view as a variation of an effective light-source shape shown in FIG. 1.

The illumination system in the exposure apparatus forms an effective light source as shown in FIG. 1. In FIG. 1, black part is light-shielding part while white part is light-transmitting part. A shape of the light source is determined by "σ" as a ratio of a NA of an illumination optical system to the NA of the projection optical system, and sizes A and B of the central light-shielding part. A shape of the effective light source is not limited to FIG. 1, but may use a shape shown in FIG. 4 that notches corners or a shape that allows the light to slightly cross the boarder of the light-shielding area.

It is necessary to initially determine a size "t" of each hole in the mask pattern to be resolved, and a size "d" of a dummy or auxiliary opening not to be resolved. The method disclosed in Japanese Patent No. 3,119,217 provides auxiliary openings of 150 nm to resolve openings of 200 nm, while the method disclosed in Japanese Laid-Open Patent Application No. 2002-122976 provides auxiliary openings of 140 nm to resolve openings of 200 nm. The size of the auxiliary opening is about seven-tenths of the main opening, but the way of determining it is indefinite.

This embodiment sets a shape of the effective light source with σ=0.9, A=0.7 and B=0.5. Influences on the critical dimension ("CD") distribution, MEF and DOF have been investigated using the opening size t and auxiliary opening size d. The pattern has a size of 120 nm shown in FIG. 3, and diameters of nine holes on the image plane exposed by the exposure apparatus have been investigated. The exposure dose this time is determined so that the lower left hole shown in FIG. 3 has a desired size of 120 nm. A deviation of the size of CD of the other eight holes from 120 nm (L: desired size) is calculated as a ratio of a difference (%) by dividing the difference by the desired size. The maximum CDi is defined as the CD deviation since the size deviates within this value:

$CDi = (CD-L)/L \times 100$

CD deviation=maximum value of CDi

MEF is a standardized index formed by dividing a difference between a size (CD) of a pattern on the image plane without any error in a mask pattern and a size (CD') of a pattern on the image plane with a certain error (CD_mask_error) in the mask pattern, by the error amount applied to the mask pattern.

Change in Pattern Size on Image plane
$CD\_error = CD' - CD$ $MEF = CD\_error / CD\_mask\_error$ An error amount is given in longitudinal and lateral directions to the mask pattern while a size of the nine major openings is made equal to that of auxiliary openings, and the image includes nine different sizes in the longitudinal and lateral directions. MEF was calculated by dividing the maximum size change by the error amount.

Figures 9, 10:
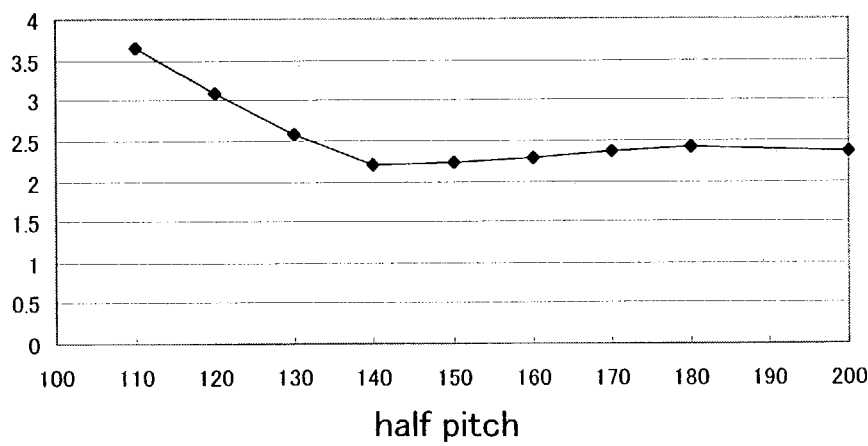
FIG. 9 is a table showing a relationship between pattern bias and depth of focus.
FIG. 10 is a graph for showing a relationship between a half pitch in a mask pattern and the mask enhancement factor.

An image-plane position is defocused in exposure, size changes of nine holes are investigated, and DOF is defined as the minimum defocus amount value when the sizes of nine holes change by 10% from the size at the best focus. Results are indicated in FIGS. 7, 8 and 9. In these figures, a size change in the lateral direction indicates a size change of the major opening "t" (including 100%, 105%, 110% and 115% of the desired size from the left) and a size change in the longitudinal direction indicates a size change of the auxiliary opening "d" (including 75%, 80%, 85%, 90% and 95% of the desired size from the bottom).

According to the CD deviation result shown in FIG. 7, the CD deviation becomes smaller with the larger size d of the auxiliary opening and the larger size t of the major opening. The smaller CD deviation is desirable. Conversely, according to the MEF result shown in FIG. 8, the MEF becomes smaller with the smaller size d of the auxiliary opening and a larger difference in size t of the major opening. The smaller MEF is desirable. According to the MEF result shown in FIG. 9, the DOF becomes larger with the larger size d of the auxiliary opening close to the size t of the major opening. The larger DOF is desirable. Therefore, MEF and CD deviation or DOF show preferable results in reverse directions.

The CD deviation may be corrected by expecting the size change on the mask pattern in advance, but the DOF and mask error sensitivity or MEF are both important factors and cannot sacrifice the other. Here, as understood from the figures, a MEF value is at most 3.2 or smaller in the varying auxiliary opening size d and major opening size t. Since the contact-hole process may permit a MEF value of 3.5 or smaller, the DOF takes precedence such that a ratio d/t between the auxiliary-opening size d and the major-opening size t meets $0.75 \leq d/t \leq 0.9$. The upper limit is the maximum auxiliary-opening size such that the auxiliary opening does not appear on the image plane, and this value slightly changes according to types of resist.

As the hole size of the desired pattern is made smaller down to 110 nm (with $k_1=0.32$), and d/t exceeds 80%, MEF exceeds 3.5 although MEF is slightly variable depending upon the effective light-source parameters. Therefore, practical MEF and DOF are obtained when d/t is set to be $0.7 \leq d/t \leq 0.8$ by taking MEF into consideration. When the effective light-source parameters vary, values of the MEF and DOF vary although relative relationships between d/t as a ratio of opening sizes and MEF, and d/t and DOF do not change.

However, this range of d/t is valid under the effective light-source shape like in FIG. 1 because the MEF has a large value and appropriate DOF is unavailable for any d/t without the effective light-source shape like FIG. 1.

This range of d/t is particularly effective to fine hole whose hole diameter meets $k_1 \leq 0.4$.

Irrespective of the above optimal ratio, the way of actually setting d and t depends upon a type of resist. The conventional exposure result empirically tells that the resist of exclusive use for holes provides a better result when the major-opening size t is close to the desired pattern size, while the resist used for line and space provides a better result when the major-opening size t is 1.1 times as large as that of the desired pattern size. Preferably, the major-opening size t is 0.8 to 1.15 times as large as that of the desired size L. Of course, an actual opening size on the mask corresponds to this size multiplied by a reciprocal of the magnification of the projection optical system.

The parameters of effective light-source shape are optimized by setting the auxiliary-opening size d to be 80% of the desired size, the major-opening size t to be 100% of the desired size, and a ratio d/t to be 0.8. Usual contact-holes include only one type of hole diameter or plural types of hole diameters within a limited range of hole diameters. The number of holes different in size, if any, is small. The pattern includes various intervals, e.g., an interval that has the same as the hole diameter to form one-to-one arrangement, an interval smaller than the hole diameter, an interval twice as long as the hole diameter, and an interval three times or more as long as the hole diameter or enough long to isolate the pattern. In general, the typical contact-hole pattern includes only one type of hole diameter and various intervals or pitches between holes. Thus, the instant embodiment investigates the MEF with only one type of hole diameter and variable pitches or intervals between holes in order to recognize general tendency of MEF.

FIG. 10 shows a change of MEF when the pitch varies with a hole diameter of 120 nm under the effective light-source shape of σ=0.9, A=0.7 and B=0.5. In FIG. 10, the MEF value increases when the pitch is smaller than the half pitch of 130 nm (with $k_1$=0.38) or pitch of 260 nm. This tendency does not change even when parameters (σ, A, B) change anyway.

The fact that the MEF becomes the largest with the minimum pitch means that only the MEF with the minimum pitch on a mask may be considered in order to optimize the effective light-source parameters σ, A and B and thereby minimize the MEF, since the MEF is small with the minimum pitch and smaller with the larger pitch.

Therefore, a pattern is used with the minimum pitch for optimization, which equalizes the half pitch to the hole diameter or has duty of 1 between the hole diameter and the interval.

Figure 11:
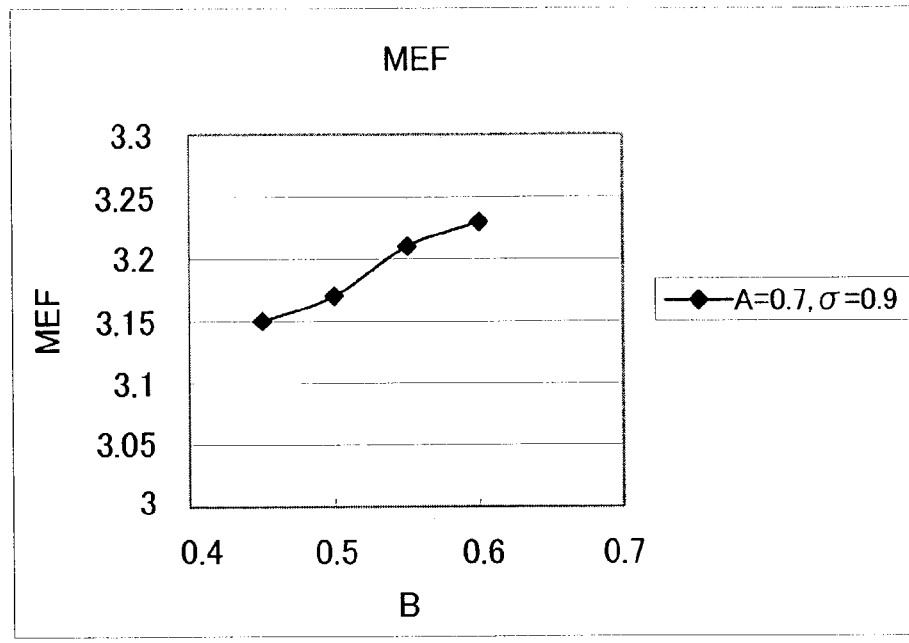
FIG. 11 is a graph for showing a relationship between the mask enhancement factor and effective light-source parameters.
Figure 12:
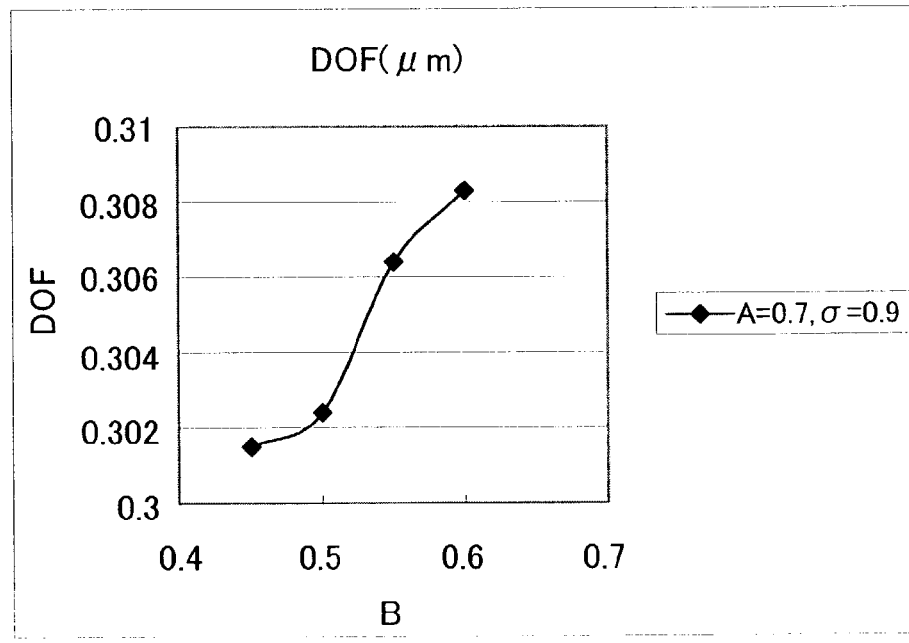
FIG. 12 is a graph for showing a relationship between the depth of focus and effective light-source parameters.

Initially, a change of the MEF is investigated by varying B while making σ and A constant. Then, a change of DOF is investigated by varying B while making σ and A constant. As discussed, the DOF is determined to be the minimum defocus amount when the sizes of nine holes change by 10% of the size with the best focus. FIGS. 11 and 12 show results of MEF and DOF, respectively.

The result of MEF in FIG. 11 shows that the MEF becomes small as the effective light-source parameter B is small. As discussed, the smaller MEF is preferable. The result of DOF in FIG. 12 shows that the DOF becomes large as the effective light-source parameter B is large. As discussed, the larger DOF is preferable.

Figure 13:
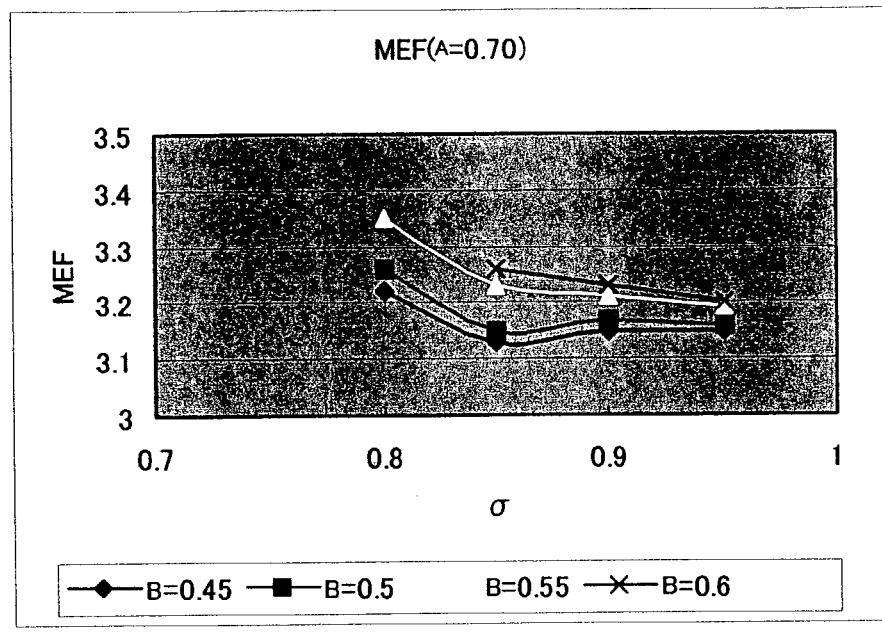
FIG. 13 is a graph for showing a relationship between the mask enhancement factor and effective light-source parameters.
Figure 14:
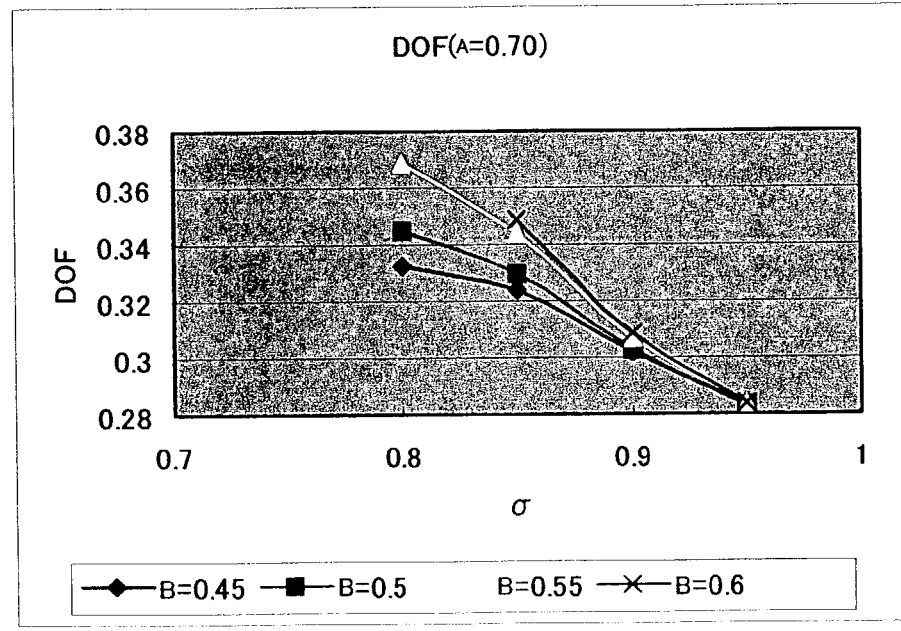
FIG. 14 is a graph for showing a relationship between the depth of focus and effective light-source parameters.

Influences of the effective light-source parameter σ on the MEF and DOF are investigated like a matrix by varying a with various A and B. As an example, FIGS. 13 and 14 show MEF and DOF with A fixed to 0.70, and B varied as 0.45, 0.5, 0.55 and 0.6. The abscissa axis is σ, and the ordinate axis is MEF or DOF in FIGS. 13 and 14. A color version of FIGS. 13 and 14 is attached to this application for better understanding.

In general, large σ includes more incident light component that is effective to fine resolution and provide contrast necessary for a fine pattern. The high contrast affects a resist image by only an error amount in the mask pattern, whereas the low contrast expands the error in the mask pattern and transfers it to the resist. Therefore, it is expected that larger a provides better contrast and is less influential on the MEF: The result in FIG. 13 shows that larger σ reduces MEF. MEF becomes minimum with certain σ, A and B. Combinations of σ, A and B to minimize the MEF have been investigated under 120 nm (with $k_1$=0.35) and it is found that MEF meets 3.00≦MEF≦3.15 when 0.85≦σ≦0.9, 0.6≦A≦0.65, 0.45≦B≦0.55.

It is in general well-known that larger σ easily resolves a fine pattern, but disadvantageously reduces the DOF. FIG. 14 appears to demonstrate this tendency even in the inventive method. Smaller σ expands the DOF, but deteriorates the MEF and the resolution of a fine pattern near the resolution limit. Therefore, the necessary DOF should be secured without deteriorating the MEF and the resolution of a fine pattern. Combinations of σ, A and B for small MEF and large DOF have been found under 120 nm (with $k_1$=0.35): 3.00≦MEF≦3.15 and 0.35≦DOF≦0.55, when σ=0.85, 0.6≦A≦0.65 and B=0.55.

The larger exposure dose tolerance is practically preferable, because the exposure dose tolerance means that the resolved contact-hole size does not change even with a slight error in the exposure dose and permits an error of the exposure dose. Therefore, constant resolving power and resolved hole size should be secured within a certain exposure dose range. Accordingly, a change of DOF is investigated when the exposure dose changes by ±5%, and the exposure light-source parameters in the illumination system are optimized so as to reduce the reduction amount.

Figure 15:
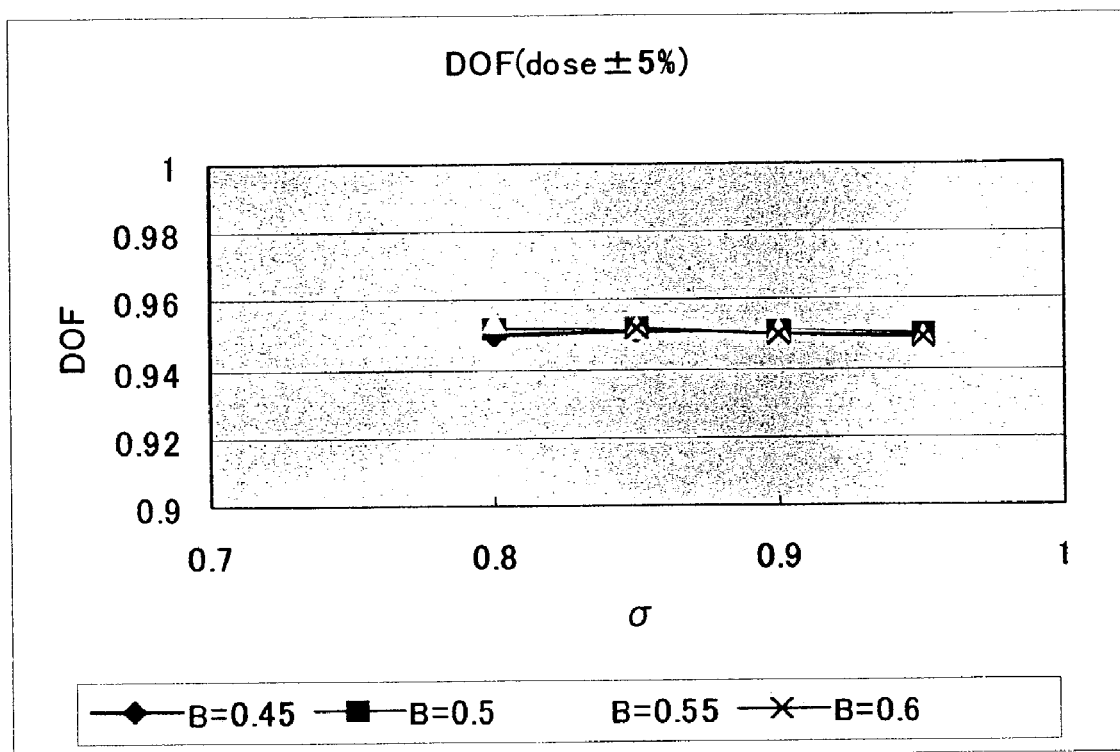
FIG. 15 is a graph for showing a relationship between a depth of focus and effective light-source parameters when exposure dose changes by 5%.

Initially, the DOF is investigated with the optimal exposure dose, and a reduction of the DOF is investigated when the exposure dose changes by ±5% compared with the former. DOF is defined as the minimum defocus amount value when the size of the nine holes changes by 10% from the size at the best focus. FIG. 15 shows the result. DOF reduces by about 5% in the holes of 120 nm when the exposure does changes by ±5% even when the effective light-source parameter values slightly change in the illumination system. The smaller hole size would start dependency upon the effective light-source parameter values. A color version of FIG. 15 is attached to the instant application for better understanding.

Thus, combinations of effective light-source parameters have been obtained which reduces MEF so that it is less affected by the mask errors, maintains sufficient DOF, and enlarges exposure dose tolerance so that even a slight error in the exposure dose may provide the constant size.

Figure 5:
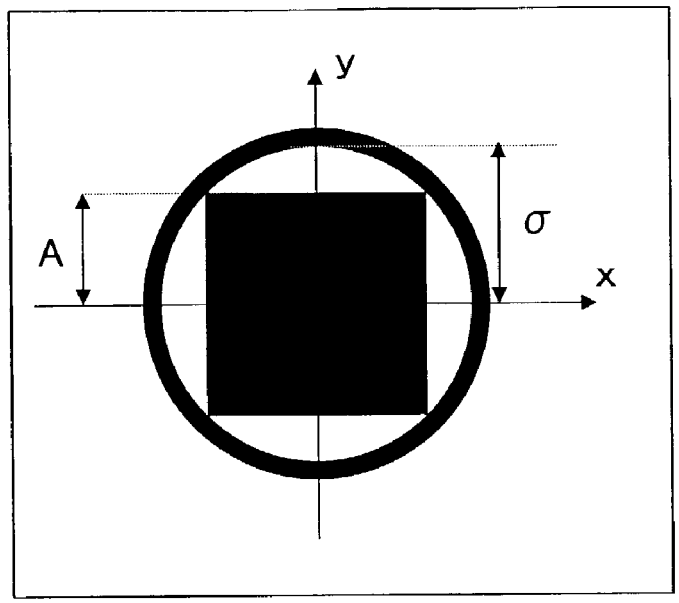
FIG. 5 is a schematic plane view of one example of an effective light-source shape unsuitable for the inventive exposure method.
Figure 6:
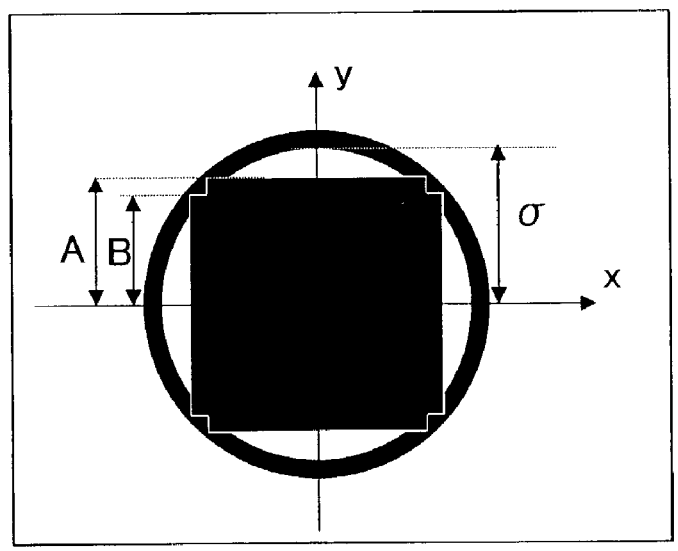
FIG. 6 is a schematic plane view of another example of an effective light-source shape unsuitable for the inventive exposure method.

A restriction condition will be discussed before combinations of the optimal parameters of the effective light source are discussed. The parameters A and B that define a size of the light-shielding part should be smaller than a radius σ over the entire area of the effective light source. Since A is defined as one larger than B, σ>A>B should be met. A=B is not included since the effective light-source distribution exits only on the X-axis and Y-axis without diagonal distribution as shown in FIG. 5. Without the diagonal distribution, a dummy resolution tends to occur and it becomes difficult to obtain the process tolerance. Similarly, the effective light-source distribution exits only on the X-axis and Y-axis without diagonal distribution when as B√2 is equal to or larger than σ as shown in FIG. 6. Therefore, B√2<σ should be met.

Next follows optimal combinations of σ, A and B that meet the above two conditions and depend upon the hole size (or resolving power $k_1$).

For 100 nm (with $k_1$=0.29), A=0.75, 0.5≦B≦0.55, σ=0.85 (0.85≦σ≦0.9).

For 110 nm (with $k_1$=0.32), A=0.70, 0.5≦B≦0.55, σ=0.85 (0.80≦σ≦0.9).

For 120 nm (with $k_1$=0.35), A=0.65, 0.5≦B≦0.55, σ=0.85 (0.80≦σ≦0.9).

For 130 nm (with $k_1$=0.38), A=0.65, 0.5≦B≦0.55, σ=0.85 (0.80≦σ≦0.9).

Therefore, a value of the effective light-source parameter A is important for hole size to be resolved in the fine hole pattern with $k_1$ is 0.4 or less. B may be a constant value near 0.55. B excessively close to A in A>B would decrease the diagonal light-source area and reduce the exposure dose tolerance. Therefore, a difference between A and B should be 0.1 or larger, i.e., B≦A−0.1. σ=0.85 would balance the MEF and DOF, and σ is adjusted in the parenthesis range so that it is made larger to reduce MEF and made smaller to improve DOF. σ excessively close to A would decrease the light-source area on the X-axis and Y-axis and deteriorate the mask error sensitivity. Therefore, a difference between σ and A should be 0.1 or larger, i.e., σ≧A+0.1, so as not to prevent the MEF from deteriorating.

The empirical rule based on this process tolerance is as follows:

$$A=A(k_1)=-1.7k_1+C1, 1.2\leq C1\leq 1.3$$

$$0.5\leq B\leq 0.55 \text{ and } B\leq A-0.1$$

$$0.80\leq \sigma\leq 0.9 \text{ and } \sigma\geq A+0.1$$

σ may be adjusted in this range so that it is made larger to reduce MEF and made smaller to improve DOF. The optimal solution that balances the MEF and DOF is A=A($k_1$)=−1.7$k_1$+1.25, B and σ distribute at centers of B=0.55 and σ=0.85 irrespective of the critical dimension under condition of $k_1 \leq 0.4$. The theoretically obtained best solution for contrast provides A={(1/$k_1$)/2−0.1}/2=1/(4$k_1$)−0.05, but this may be slightly corrected for process tolerance as A=1/(4$k_1$)−C2/(4$k_1$)$^2$, where C2 is valid in a range of 0.07≦C2≦0.20. C2=0.12 provides a solution that balances the MEF and DOF.

EXAMPLE

Figure 18:
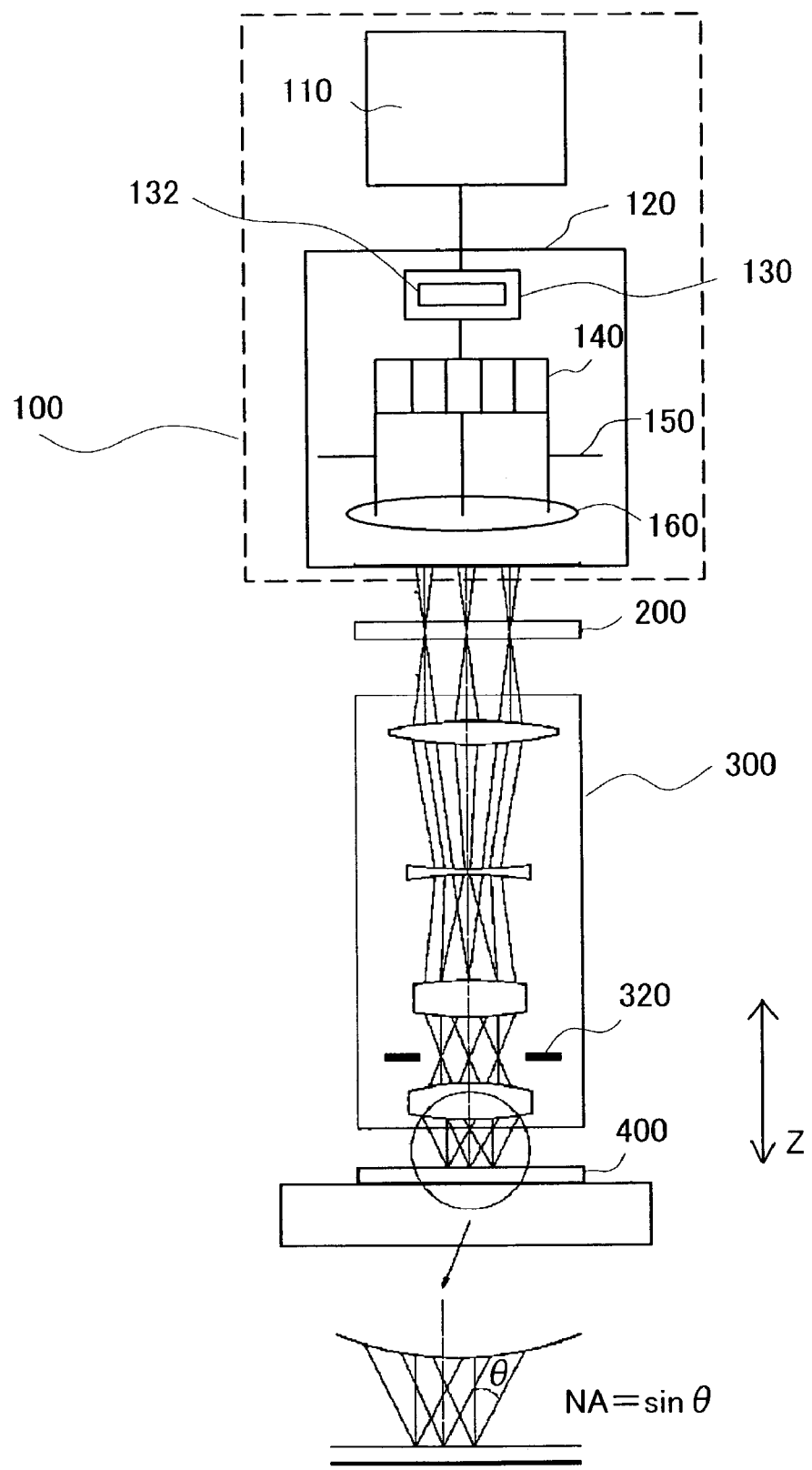
FIG. 18 is a schematic block diagram of an exposure apparatus used for one embodiment according to the present invention.

A description will be given of an exposure apparatus according to the present invention with reference to FIG. 18. Here, FIG. 18 is a schematic block diagram of the exposure apparatus. The exposure apparatus includes, as shown in FIG. 18, an illumination apparatus 100, a mask 200, a projection optical system 300, and a wafer 400. The exposure apparatus of the instant embodiment is an exposure apparatus that exposes a circuit pattern created on the mask 200 onto the wafer 400 in a step-and-scan manner.

The illumination apparatus 100 illuminates the binary mask 200 that forms a contact-hole pattern, and includes a light source section 110 and an illumination optical system 120. The light source section 110 includes KrF excimer laser with a wavelength of about 248 nm as a light source and a necessary beam shaping system.

The illumination optical system 120 is an optical system to illuminates the mask 200, and includes a condenser optical system 130, a fly-eye lens 140, an aperture stop 150, and a condenser lens 160 in the instant embodiment.

The condenser optical system 130 includes one or more mirrors and lenses necessary for deflection, and maintains the light that has passed them substantially parallel to any lens element at the center and peripheral of the fly-eye lens 140. The condenser optical system 130 includes an exposure-dose adjustment part 132 that may change the exposure dose of the illumination light to the binary mask 200 for each illumination. The exposure-dose adjustment part 132 adjusts the exposure dose based on contrast necessary for the desired contact holes on the mask 200 and/or wafer 400.

The fly-eye lens 140 makes uniform the illumination light to the mask 200, and emits the light while converting an angular distribution of the incident light into a positional distribution. The aperture stop 150 is provided just after the exit surface of the fly-eye lens 140, which has a fixed shape and diameter. This aperture stop 150 has an aperture shape shown in FIG. 1 or 4 to illuminate the mask 200, and thus restrains the exposure dose to the dummy resolution pattern while enhancing the exposure dose to the desired contact-hole pattern.

The aperture stop 150 is located at a position conjugate with a pupil surface 320 in the projection optical system 300, and the aperture shape of the aperture stop 150 corresponds to the effective light source shape on the pupil surface 320 in the projection optical system 300.

The binary mask 200 forms a pattern shown in FIG. 2 to obtain the desired pattern with a hole diameter of 120 nm shown in FIG. 3, and sets t=120 nm and d=90 nm for the hole diameter converted into that on the wafer 400.

The projection optical system 300 images diffracted light through the contact-hole pattern formed on the mask 200 onto the wafer 400. 320 is the pupil surface in this projection optical system 300. The projection optical system 300 of the instant embodiment has an NA of 0.73. Photoresist is applied onto the wafer 400.

The exposure apparatus obtains a size of a desired hole by reading out a barcode on the mask 200, and automatically sets an optimal effective light source in the illumination optical system. Alternatively, the effective light source in the illumination system may be set by inputting effective light-source parameters into the exposure apparatus. When the input value of the effective light-source parameters offset from the optimal parameter values, the exposure apparatus may output optimal parameter values with warning on its console screen.

When the input value of the effective light-source parameter falls within σ≦A, A=B and B√2≧σ, an error message emits so as not to enter the input value and prompt to input the optimal parameter value.

The instant embodiment sets effective σ of the illumination light to 0.85, the lengths A and B in the light-shielding part to 0.7 and 0.5. The exposure-dose adjustment part 132 sets a light intensity ratio to 1:1 between the illumination light that has an intensity distribution peak of the light near the optical axis and the illumination light that has an intensity distribution peak near at diagonals, adjusting the exposure dose evenly.

The exposure apparatus exposes the binary mask 200 after setting a wafer plate onto which an anti-reflection film AR3 (60 nm) and photoresist TDK-DP746HC with a thickness of 350 nm are applied. Then, the post exposure bake ("PEB") continues for 90 seconds at temperature of 140° C., followed by the development for 60 seconds at 23° C. using developer of NMD-3. The exposure sets the exposure dose every 5 mJ/cm$^2$ from 250 mJ/cm$^2$ to 400 mJ/cm$^2$ and varies it in a focus direction.

Figure 16:
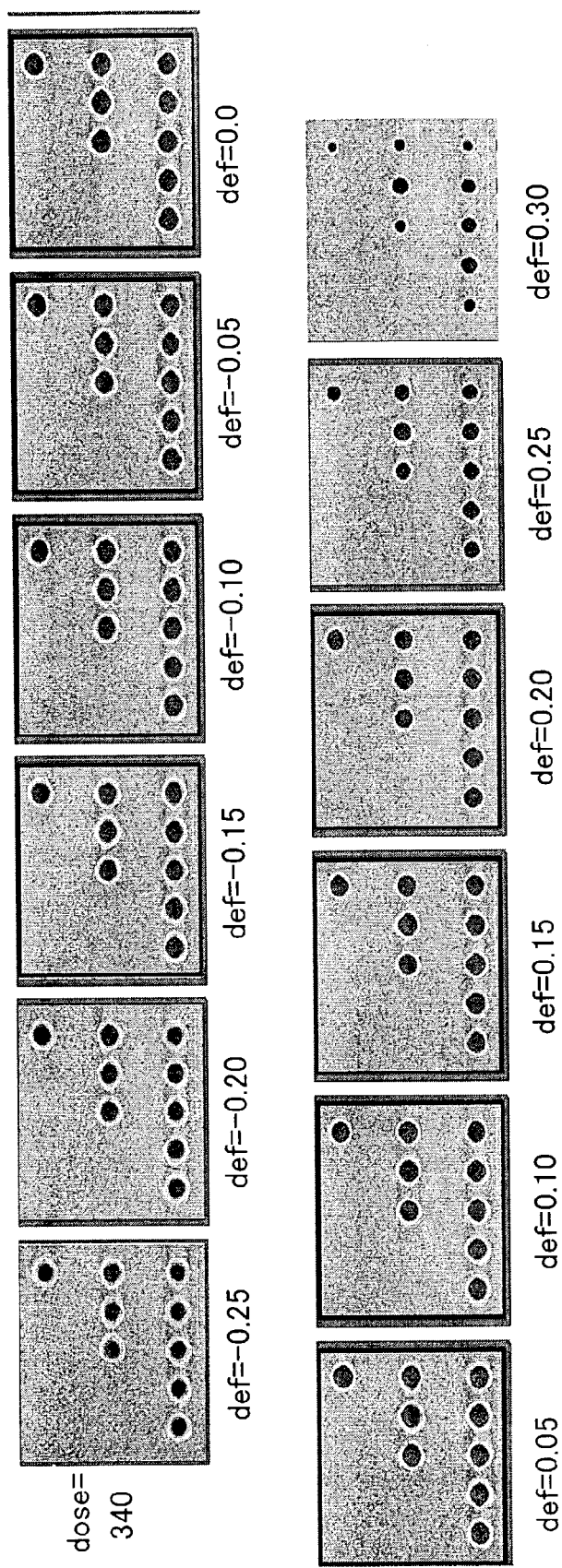
FIG. 16 is an exposure test result of one embodiment according to the present invention.

FIG. 16 shows an exposure result with the exposure dose of 340 mJ/cm$^2$. An exposure result with other exposure dose is omitted. The exposure result changes a focus position at a pitch of 0.05 μm with a defocus amount of −0.25 μm to 0.30 μm in a lateral direction. Referring to FIG. 16, the exposure result at 0.30 μm shows that part of holes does not perforate through the resist while the resist shows successful perforation with other defocus amounts of −0.25 μm to 0.25 μm without hole size reduction. The hole size deviates within ±10% of a certain size with the defocus amount from 0.15 μm to 0.20 μm. In other words, each hole is dimensioned from 108 nm to 132 nm for a certain size of 120 nm. DOF of 0.35 μm is obtained.

Figure 17:
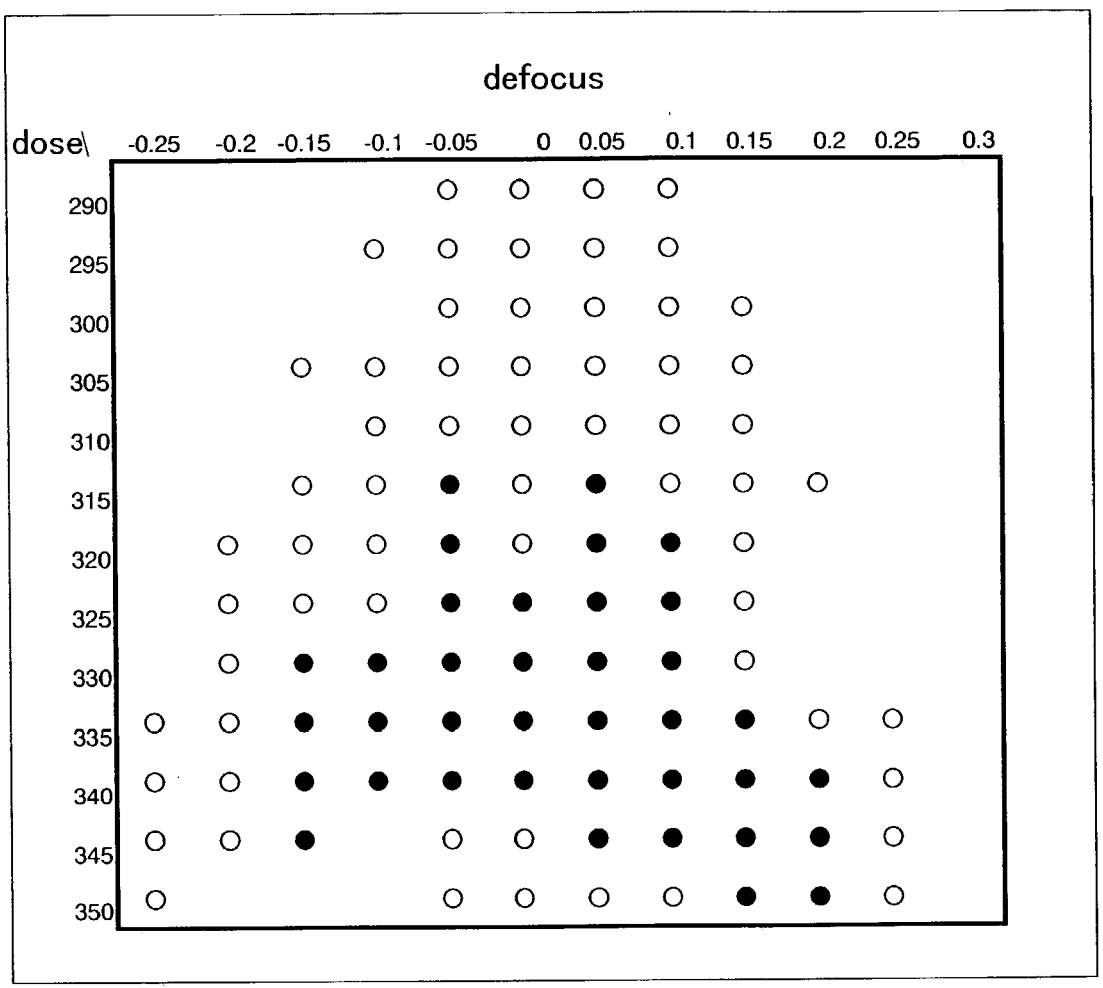
FIG. 17 is a process window showing a relationship between the exposure dose and defocus amount.

FIG. 17 shows a process window when the exposure dose and defocus amount change, in which the abscissa axis indicates a change of focus and the ordinate axis indicates a change of exposure dose. FIG. 17 uses ○ to show a successful perforation of the hole down to the wafer substrate without hole size reduction, and ● to show that an observed value of the hole size is within ±10% of the certain size. Strict criteria applied because ○ is not given when the hole perforates but with hole size reduction and ● is not given when even one hole among the nine holes deviates from the predetermined range by 1 nm. Nevertheless, the exposure dose tolerance of 20 mJ/cm$^2$ provides about 0.3 DOF.

The sufficient process tolerance was similarly obtained for a mask pattern with t=120 nm and d=100 nm converted into those on the wafer for the desired size of 120 nm. This case used smaller optimal exposure dose and thus showed a slightly advantageous result in view of throughput.

Figure 19:
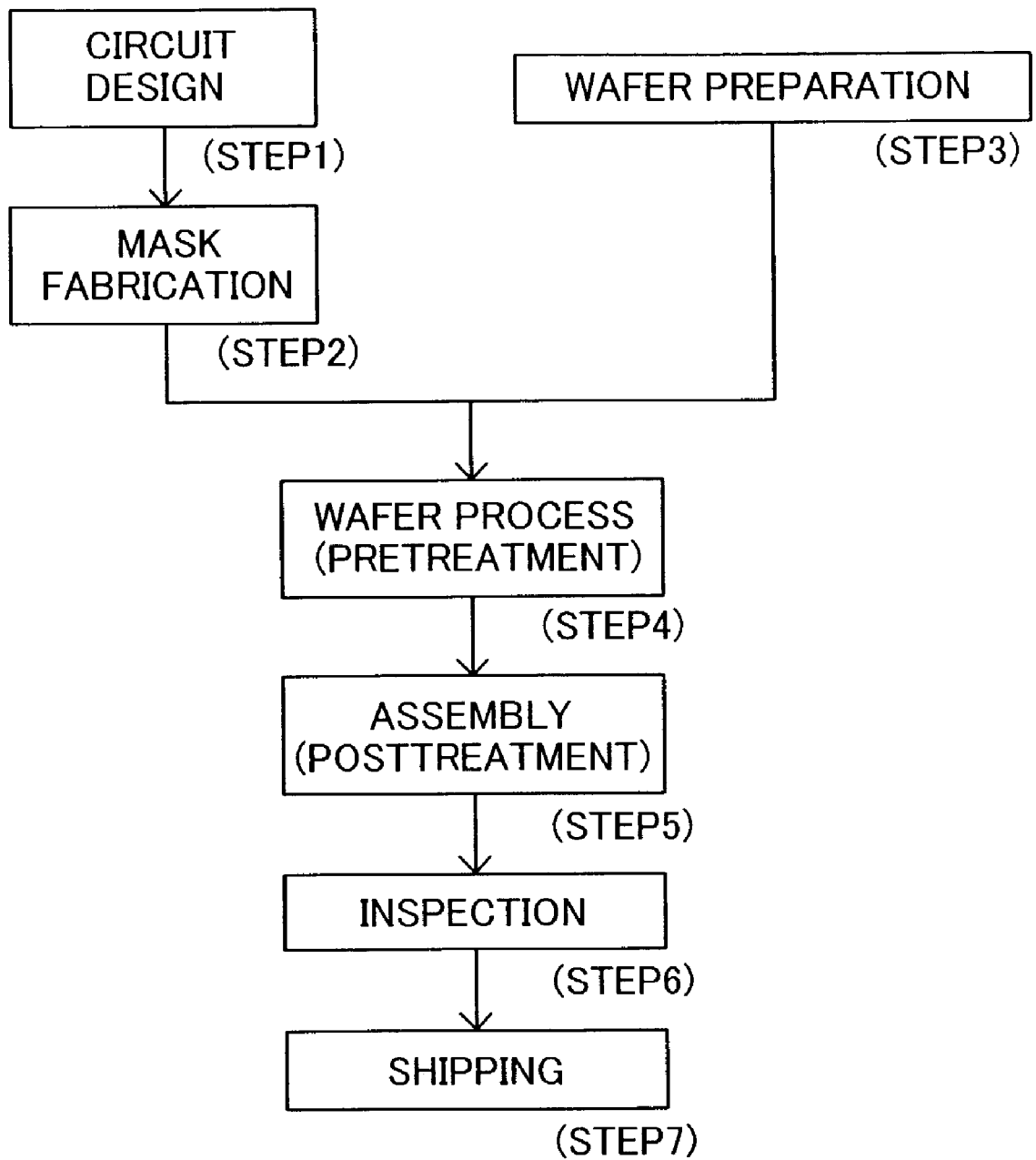
FIG. 19 is a flowchart for explaining a device fabricating method using the exposure apparatus of the present invention.
Figure 20:
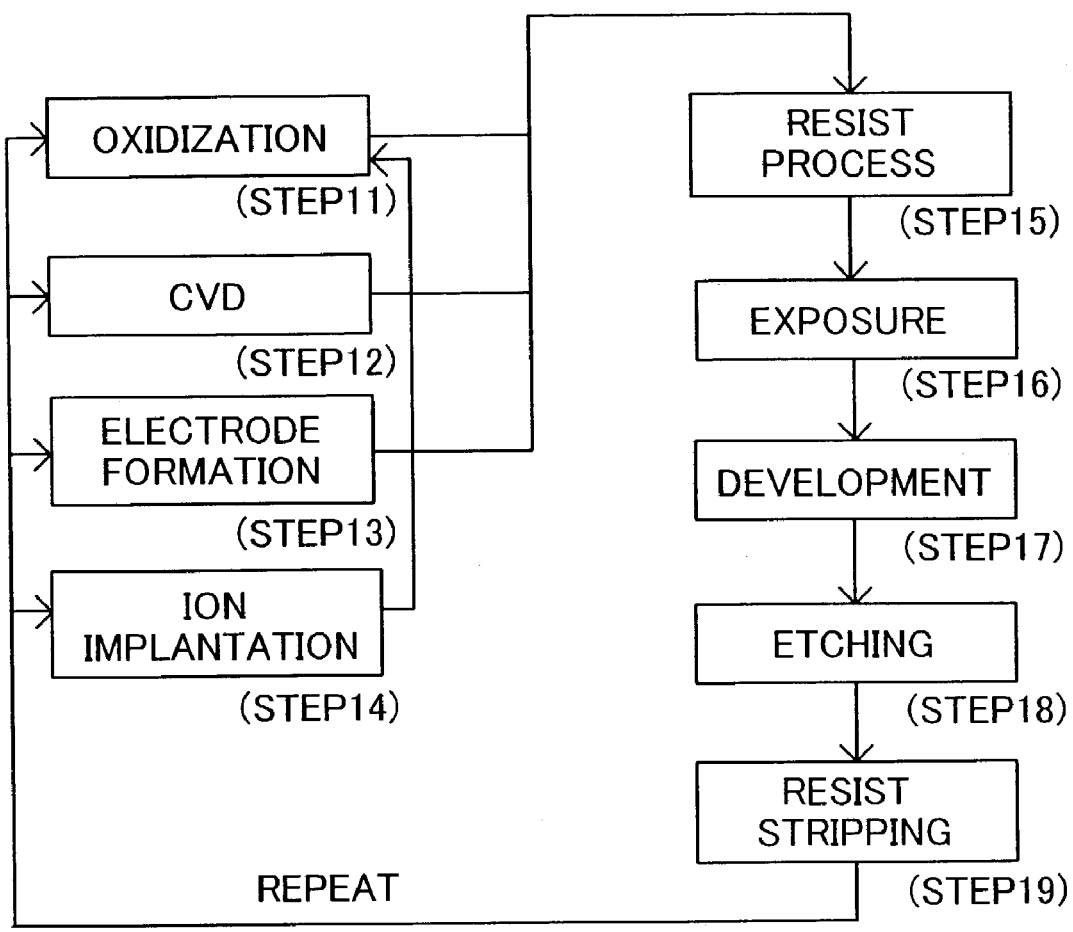
FIG. 20 is a detailed flowchart for step 4 shown in FIG. 19.

Referring now to FIGS. 19 and 20, a description will be given of an embodiment of a device fabrication method using the above mentioned exposure apparatus. FIG. 19 is a flowchart for explaining how to fabricate devices (i.e., semiconductor chips such as IC and LSI, LCDs, CCDs, and the like). Here, a description will be given of the fabrication of a semiconductor chip as an example. Step 1 (circuit design) designs a semiconductor device circuit. Step 2 (mask fabrication) forms a mask having a designed circuit pattern. Step 3 (wafer making) manufactures a wafer using materials such as silicon. Step 4 (wafer process), which is also referred to as a pretreatment, forms actual circuitry on the wafer through lithography using the mask and wafer. Step 5 (assembly), which is also referred to as a post-treatment, forms into a semiconductor chip the wafer formed in Step 4 and includes an assembly step (e.g., dicing, bonding), a packaging step (chip sealing), and the like. Step 6 (inspection) performs various tests for the semiconductor device made in Step 5, such as a validity test and a durability test. Through these steps, a semiconductor device is finished and shipped (Step 7).

FIG. 20 is a detailed flowchart of the wafer process in Step 4. Step 11 (oxidation) oxidizes the wafer's surface. Step 12 (CVD) forms an insulating film on the wafer's surface. Step 13 (electrode formation) forms electrodes on the wafer by vapor disposition and the like. Step 14 (ion implantation) implants ion into the wafer. Step 15 (resist process) applies a photosensitive material onto the wafer. Step 16 (exposure) uses the exposure apparatus 300 to expose a circuit pattern on the mask onto the wafer. Step 17 (development) develops the exposed wafer. Step 18 (etching) etches parts other than a developed resist image. Step 19 (resist stripping) removes disused resist after etching. These steps are repeated, and multi-layer circuit patterns are formed on the wafer. Use of the fabrication method in this embodiment helps fabricate higher-quality devices than ever. Thus, the device fabrication method using the exposure apparatus 1 and the resultant device constitute one aspect of the present invention.

Thus, the present invention may provide an exposure apparatus that uses a usual exposure apparatus with KrF excimer laser with a wavelength of 248 nm and NA of 0.73 to realize resolving power $k_1=0.35$ or smaller with practical DOF and resolve fine opening of 120 nm or smaller.

What is claimed is:

1. An exposure method comprising the steps of:
providing a mask that arranges a contact-hole pattern and a pattern smaller than the contact-hole pattern; and
illuminating the mask by using an effective light source so as to resolve the contact-hole pattern and restrain the smaller pattern from resolving on an object to be exposed via a projection optical system,
wherein the following conditions are met:

$A=-1.7k_1+C1, 1.2 \leq C1 \leq 1.3$ $0.5 \leq B \leq 0.55$ and $B \leq A-0.1$ $0.80 \leq \sigma \leq 0.9$ and $\sigma \geq A+0.1$ $k_1=(L/\lambda)NA,$ where $k_1$ is resolving power, L is a hole diameter of the contact-hole pattern, $\lambda$ is a wavelength for exposure, NA is a numerical aperture of the projection optical system, $\sigma$ is a ratio of a numerical aperture of an illumination optical system to the numerical aperture of the projection optical system, A and B are distances from two orthogonal axes to a boarder of a light-shielding part in said effective light source, the light-shielding part being symmetrical with respect to the two orthogonal axes.

2. An exposure method according to claim 1, wherein conditions $A=-1.7k_1+1.25$, $k_1 \leq 0.4$, $B=0.55$, $\sigma=0.85$ are met irrespective of a critical dimension.

3. An exposure method comprising the steps of:
providing a mask that arranges a contact-hole pattern and a pattern smaller than the contact-hole pattern; and
illuminating the mask using plural kinds of light so as to resolve the contact-hole pattern and restrain the smaller pattern from resolving on an object to be exposed via a projection optical system,
wherein the following conditions are met:

$A=1/(4k_1)-C2/(4k_1)^2, 0.07 \leq C2 \leq 0.20$ $0.5 \leq B \leq 0.55$ and $B \leq A-0.1$ $0.80 \leq -\sigma \leq 0.9$ and $\sigma \geq A+0.1$ $k_1=(L/\lambda)NA,$ where $k_1$ is resolving power, L is a hole diameter of the contact-hole pattern, $\lambda$ is a wavelength for exposure, NA is a numerical aperture of the projection optical system, $\sigma$ is a ratio of a numerical aperture of an illumination optical system to the numerical aperture of the projection optical system, A and B are distances from two orthogonal axes to a boarder of a light-shielding part in an effective light source for illumination of plural kinds of light, the light-shielding part being symmetrical with respect to the two orthogonal axes.

4. A device manufacturing method comprising the steps of:
exposing a pattern formed on a reticle onto an object by using an exposure method; and
performing a predetermined process for the exposed object,
wherein the exposure method includes the steps of providing a mask that arranges a contact-hole pattern and a pattern smaller than the contact-hole pattern, and illuminating the mask using plural kinds of light so as to resolve the contact-hole pattern and restrain the smaller pattern from resolving on an object to be exposed via a projection optical system, wherein the following conditions are met:

$A=-1.7k_1+C1, 1.2 \leq C1 \leq 1.3$ $0.5 \leq B \leq 0.55$ and $B \leq A-0.1$ $0.80 \leq \sigma \leq 0.9$ and $\sigma \geq A+0.1$ $k_1=(L/\lambda)NA,$ where $k_1$ is resolving power, L is a hole diameter of the contact-hole pattern, $\lambda$ is a wavelength for exposure, NA is a numerical aperture of the projection optical system, $\sigma$ is a ratio of a numerical aperture of an illumination optical system to the numerical aperture of the projection optical system, A and B are distances from two orthogonal axes to a boarder of a light-shielding part in an effective light source for illumination of plural kinds of light, the light-shielding part being symmetrical with respect to the two orthogonal axes.

5. A device manufacturing method comprising the steps of:
exposing a pattern formed on a reticle onto an object by using an exposure method; and performing a predetermined process for the exposed object, wherein the exposure method includes the steps of providing a mask that arranges a contact-hole pattern and a pattern smaller than the contact-hole pattern, and illuminating the mask using plural kinds of light so as to resolve the contact-hole pattern and restrain the smaller pattern from resolving on an object to be exposed via a projection optical system, wherein the following conditions are met:

$A=1/(4k_1)+C2/(4k_1)^2$, $0.07 \leq C2 \leq 0.20$ $0.5 \leq B \leq 0.55$ and $B \leq A-0.1$ $0.80 \leq \sigma \leq 0.9$ and $\sigma \geq A+0.1$ $k_1=(L/\lambda)NA$, where $k_1$ is resolving power, L is a hole diameter of the contact-hole pattern, $\lambda$ is a wavelength for exposure, NA is a numerical aperture of the projection optical system, $\sigma$ is a ratio of a numerical aperture of an illumination optical system to the numerical aperture of the projection optical system, A and B are distances from two orthogonal axes to a boarder of a light-shielding part in an effective light source for illumination of plural kinds of light, the light-shielding part being symmetrical with respect to the two orthogonal axes.

* * * * *

UNITED STATES PATENT AND TRADEMARK OFFICE
CERTIFICATE OF CORRECTION

PATENT NO. : 6,991,896 B2
DATED : January 31, 2006
INVENTOR(S) : Miyoko Kawashima It is certified that error appears in the above-identified patent and that said Letters Patent is hereby corrected as shown below:

Column 4,
Line 40, delete "a parameter a" and insert -- a parameter σ --.

Column 7,
Line 42, delete "by varying a" and insert -- by varying σ --.
Line 54, delete "a provides" and insert -- σ provides --.

Signed and Sealed this

Eleventh Day of April, 2006

JON W. DUDAS
*Director of the United States Patent and Trademark Office*